US012804809B2

(12) United States Patent
Sakurai et al.

(10) Patent No.: US 12,804,809 B2
(45) Date of Patent: Nov. 17, 2026

(54) COPPER/CERAMIC JOINED BODY AND INSULATED CIRCUIT BOARD

(71) Applicant: MITSUBISHI MATERIALS CORPORATION, Tokyo (JP)

(72) Inventors: Akira Sakurai, Saitama (JP); Nobuyuki Terasaki, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 209 days.

(21) Appl. No.: 18/688,801

(22) PCT Filed: Dec. 2, 2022

(86) PCT No.: PCT/JP2022/044561
§ 371 (c)(1),
(2) Date: Mar. 4, 2024

(87) PCT Pub. No.: WO2023/106226
PCT Pub. Date: Jun. 15, 2023

(65) Prior Publication Data

US 2024/0414841 A1 Dec. 12, 2024

(30) Foreign Application Priority Data

Dec. 10, 2021 (JP) ................................ 2021-200811
Nov. 29, 2022 (JP) ................................ 2022-190220

(51) Int. Cl.
*H05K 1/02* (2006.01)
*H05K 1/05* (2006.01)

(52) U.S. Cl.
CPC .......... *H05K 1/053* (2013.01); *H05K 1/0209* (2013.01); *H05K 1/0271* (2013.01); *H05K 2201/062* (2013.01)

(58) Field of Classification Search
CPC .... H05K 1/053; H05K 1/0209; H05K 1/0271; H05K 2201/062
See application file for complete search history.

(56) References Cited

U.S. PATENT DOCUMENTS

2015/0208496 A1 7/2015 Terasaki et al.
2015/0284296 A1 10/2015 Osanai et al.
2023/0034784 A1* 2/2023 Terasaki ............... C04B 37/026

FOREIGN PATENT DOCUMENTS

JP H05148053 A 6/1993
JP 3211856 B2 9/2001
(Continued)

OTHER PUBLICATIONS

International Search Report mailed Feb. 14, 2023, issued for PCT/JP2022/044561 and English translation thereof.
(Continued)

*Primary Examiner* — Jeremy C Norris
(74) *Attorney, Agent, or Firm* — Troutman Pepper Locke LLP

(57) ABSTRACT

This copper/ceramic bonded body includes a copper member consisting of copper or a copper alloy and a ceramic member, wherein the copper member is bonded to the ceramic member, an active metal compound layer consisting of an active metal compound is formed on a side of the ceramic member at a bonded interface between the ceramic member and the copper member, microcracks that extend from the bonded interface toward an inner side of the ceramic member are present in the ceramic member, and at least a part of the microcracks are filled with the active metal compound.

16 Claims, 5 Drawing Sheets

(56) References Cited

FOREIGN PATENT DOCUMENTS

| | | | |
|---|---|---|---|
| JP | 2001-313453 | A | 11/2001 |
| JP | 2009-280494 | A | 12/2009 |
| JP | 5038565 | B2 | 10/2012 |
| JP | 2014-101248 | A | 6/2014 |
| JP | 5757359 | B2 | 7/2015 |
| JP | 2015-180600 | A | 10/2015 |
| JP | 2018-008869 | A | 1/2018 |
| JP | 2018-137396 | A | 8/2018 |
| JP | 2021012974 | A | 2/2021 |
| WO | 2014/080536 | A1 | 5/2014 |

OTHER PUBLICATIONS

Office Action mailed Jun. 23, 2026, issued for JP2022-190220 and English translation thereof.

* cited by examiner

COPPER/CERAMIC JOINED BODY AND INSULATED CIRCUIT BOARD

TECHNICAL FIELD

The present invention relates to a copper/ceramic bonded body (joined body) obtained by bonding a copper member consisting of copper or a copper alloy to a ceramic member, and an insulated circuit board obtained by bonding a copper sheet consisting of copper or a copper alloy to a surface of the ceramic substrate.

The present application claims priority on Japanese Patent Application No. 2021-200811 filed on Dec. 10, 2021, and Japanese Patent Application No. 2022-190220 filed on Nov. 29, 2022, the contents of which are incorporated herein by reference.

BACKGROUND ART

A power module, an LED module, and a thermoelectric module have a structure in which a power semiconductor element, an LED element, or a thermoelectric element is bonded to an insulated circuit board, and a circuit layer consisting of a conductive material is formed on one surface of an insulating layer in the insulated circuit board.

For example, a power semiconductor element for high power control, which is used for controlling a wind power generation, an electric vehicle, a hybrid vehicle, or the like, generates a large amount of heat during operation, and thus, an insulated circuit board including: a ceramic substrate; a circuit layer which is formed by bonding a metal plate having excellent electrical conductivity to one surface of the ceramic substrate; and a metal layer for heat radiation which is formed by bonding a metal plate to the other surface of the ceramic substrate has been widely used in the related art as a substrate on which the power semiconductor element is mounted.

For example, Patent Document 1 proposes an insulated circuit board in which a circuit layer and a metal layer are formed by bonding a copper sheet to each of one surface and the other surface of a ceramic substrate. In Patent Document 1, the copper sheet is disposed on each of one surface and the other surface of the ceramic substrate with an Ag—Cu—Ti-based brazing material being interposed, and then a heat treatment is carried out to bond the copper sheet to the ceramic substrate (so-called active metal brazing method).

In addition, Patent Document 2 proposes a power module substrate in which a copper sheet consisting of copper or a copper alloy is bonded to a ceramic substrate consisting of AlN or $Al_2O_3$ by using a bonding material containing Ag and Ti.

Further, Patent Document 3 proposes a power module substrate in which a copper sheet consisting of copper or a copper alloy is bonded to a ceramic substrate consisting of silicon nitride by using a bonding material containing Ag and Ti.

As described above, in a case of bonding a copper sheet to a ceramic substrate using a bonding material containing Ti, the Ti which is an active metal reacts with the ceramic substrate; and thereby, the wettability of the bonding material is improved, and the bonding strength between the copper sheet and the ceramic substrate is improved.

In the above-described insulated circuit board, it is necessary to suppress the occurrence of breaking in the ceramic substrate even in a case where a thermal cycle is loaded.

In order to suppress breaking in a ceramic substrate, for example, Patent Document 4 discloses an insulated circuit board that uses a ceramic substrate including no microcracks.

In addition, Patent Document 5 discloses an insulated circuit board that uses a ceramic substrate having a specified surface roughness.

CITATION LIST

Patent Documents

[Patent Document 1]
Japanese Patent No. 3211856
[Patent Document 2]
Japanese Patent No. 5757359
[Patent Document 3]
Japanese Unexamined Patent Application, First Publication No. 2018-008869
[Patent Document 4]
Japanese Unexamined Patent Application, First Publication No. 2009-280494
[Patent Document 5]
Japanese Patent No. 5038565

SUMMARY OF INVENTION

Technical Problem

By the way, in recent years, there is a tendency that a heat generation temperature of a semiconductor element mounted on an insulated circuit board increases, and an insulated circuit board is required to have a thermal cycle reliability that can withstand a thermal cycle more severe than a thermal cycle in the related art.

In a case of bonding a copper sheet to a ceramic substrate using a bonding material containing Ti, as described above, there is a risk in that the vicinity of the bonded interface becomes hard, breaking occurs in the ceramic member during loading of a thermal cycle, and the thermal cycle reliability deteriorates.

In addition, even in the insulated circuit boards, which are described in Patent Document 4 in which microcracks in a ceramic substrate are reduced, and Patent Document 5 in which a surface roughness of a ceramic substrate is specified, there is a concern that the breaking in the ceramic substrate cannot be sufficiently suppressed in a case where a severe thermal cycle is loaded.

The present invention has been made in consideration of the above-described circumstances, and an objective of the present invention is to provide a copper/ceramic bonded body having an excellent thermal cycle reliability, which can suppress the occurrence of breaking in a ceramic member even in a case where a severe thermal cycle is loaded, and an insulated circuit board consisting of the copper/ceramic bonded body.

Solution to Problem

In order to solve the above-described problems, a copper/ceramic bonded body according to an aspect 1 of the present invention includes a copper member consisting of copper or a copper alloy and a ceramic member, wherein the copper member is bonded to the ceramic member, an active metal compound layer consisting of an active metal compound is formed on a side of the ceramic member at a bonded interface between the ceramic member and the copper member, and microcracks that extend from the bonded interface toward an inner side of the ceramic member are present in the ceramic member, and at least a part of the microcracks are filled with the active metal compound.

According to the copper/ceramic bonded body according to the aspect 1 of the present invention, since microcracks that extend from the bonded interface toward an inner side of the ceramic member are present in the ceramic member, and at least a part of these microcracks are filled with the active metal compound, it is possible to suppress the occurrence of ceramic breaking starting from the microcracks, and it is possible to suppress the occurrence of breaking of the ceramic member during loading of a thermal cycle. In addition, due to the anchor effect of the active metal compound filled into the microcracks, it is possible to increase the bonding strength between the ceramic member and the copper member.

Therefore, even in a case where a severe thermal cycle is loaded, it is possible to suppress the breaking in the ceramic member or the decrease in the bonding rate, and it is possible to improve the thermal cycle reliability.

A copper/ceramic bonded body according to an aspect 2 of the present invention is the copper/ceramic bonded body according to the aspect 1 of the present invention, wherein in the microcrack filled with the active metal compound, a maximum depth H from the bonded interface is set to be in a range of 0.3 μm or more and 3.0 μm or less.

According to the copper/ceramic bonded body according to the aspect 2 of the present invention, since in the microcrack filled with the active metal compound, a maximum depth H from the bonded interface is set to 0.3 μm or more, the anchor effect of the active metal compound filled into the microcracks makes it possible to reliably improve the bonding strength. In addition, since in the microcrack filled with the active metal compound, a maximum depth H from the bonded interface is set to 3.0 μm or less, it is possible to reliably suppress the occurrence of breaking in the ceramic member, where the breaking is caused by this microcrack.

A copper/ceramic bonded body according to an aspect 3 of the present invention is the copper/ceramic bonded body according to the aspect 1 or 2 of the present invention, wherein a width W of the microcrack filled with the active metal compound is 0.3 μm or less.

According to the copper/ceramic bonded body according to the aspect 3 of the present invention, since the width W of the microcrack filled with the active metal compound is limited to 0.3 μm or less, it is possible to reliably suppress the occurrence of breaking in the ceramic member, where the breaking is caused by this microcrack.

A copper/ceramic bonded body according to an aspect 4 of the present invention is the copper/ceramic bonded body according to any one of the aspect 1 to the aspect 3, wherein a thickness t1 of the active metal compound layer is set to be in a range of 40 nm or more and 600 nm or less.

According to the copper/ceramic bonded body according to the aspect 4 of the present invention, since the thickness t1 of the active metal compound layer is set to be in a range of 40 nm or more and 600 nm or less, the active metal reliably and firmly bonds the ceramic member and the copper member, and concurrently, the hardening of the bonded interface is further suppressed.

A copper/ceramic bonded body according to an aspect 5 of the present invention is the copper/ceramic bonded body according to any one of the aspect 1 to the aspect 4, wherein an Ag—Cu alloy layer is formed on a side of the copper member at the bonded interface between the ceramic member and the copper member, and a thickness t2 of the Ag—Cu alloy layer is set to be in a range of 1.5 μm or more and 30 μm or less.

According to the copper/ceramic bonded body according to the aspect 5 of the present invention, Ag of the bonding material is sufficiently reacted with the copper member to bond the ceramic member and the copper member reliably and firmly, and concurrently, the hardening of the bonded interface is further suppressed.

An insulated circuit board according to an aspect 6 of the present invention includes a copper sheet consisting of copper or a copper alloy and a ceramic substrate, wherein the copper sheet is bonded to a surface of the ceramic substrate, an active metal compound layer consisting of an active metal compound is formed on a side of the ceramic substrate at a bonded interface between the ceramic substrate and the copper sheet, and microcracks that extend from the bonded interface toward an inner side of the ceramic substrate are present in the ceramic substrate, and at least a part of the microcracks are filled with the active metal compound.

According to the insulated circuit board according to the aspect 6 of the present invention, since microcracks that extend from the bonded interface toward an inner side of the ceramic substrate are present in the ceramic substrate, and at least a part of the microcracks are filled with the active metal compound, it is possible to suppress the occurrence of ceramic breaking starting from the microcracks, and it is possible to suppress the occurrence of breaking of the ceramic substrate during loading of a thermal cycle. In addition, due to the anchor effect of the active metal compound filled into the microcracks, it is possible to increase the bonding strength between the ceramic substrate and the copper sheet.

Therefore, even in a case where a severe thermal cycle is loaded, it is possible to suppress the breaking in the ceramic substrate or the decrease in the bonding rate, and it is possible to improve the thermal cycle reliability.

An insulated circuit board according to an aspect 7 of the present invention is the insulated circuit board according to the aspect 6 of the present invention, wherein in the microcrack filled with the active metal compound, a maximum depth H from the bonded interface is set to be in a range of 0.3 μm or more and 3.0 μm or less.

According to the insulated circuit board according to the aspect 7 of the present invention, since in the microcrack filled with the active metal compound, a maximum depth H from the bonded interface is set to 0.3 μm or more, the anchor effect of the active metal compound filled into the microcracks makes it possible to reliably improve the bonding strength. In addition, since in the microcrack filled with the active metal compound, a maximum depth H from the bonded interface is set to 3.0 μm or less, it is possible to reliably suppress the occurrence of breaking in the ceramic substrate, where the breaking starts from the microcrack.

An insulated circuit board according to an aspect 8 of the present invention is the insulated circuit board according to the aspect 6 or the aspect 7 of the present invention, wherein a width W of the microcrack filled with the active metal compound is 0.3 μm or less.

According to the insulated circuit board according to the aspect 8 of the present invention, since the width W of the microcrack filled with the active metal compound is limited to 0.3 μm or less, it is possible to reliably suppress the occurrence of breaking in the ceramic substrate, where the breaking starts from the microcrack.

An insulated circuit board according to an aspect 9 of the present invention is the insulated circuit board according to any one of the aspect 6 to the aspect 8 of the present invention, wherein a thickness t1 of the active metal compound layer is set to be in a range of 40 nm or more and 600 nm or less.

According to the insulated circuit board according to the aspect 9 of the present invention, since the thickness t1 of the active metal compound layer is set to be in a range of 40 nm or more and 600 nm or less, the active metal reliably and firmly bonds the ceramic substrate and the copper sheet, and concurrently, the hardening of the bonded interface is further suppressed.

An insulated circuit board according to an aspect 10 of the present invention is the insulated circuit board according to any one of the aspect 6 to the aspect 9 of the present invention, wherein an Ag—Cu alloy layer is formed on the side of the copper sheet at the bonded interface between the ceramic substrate and the copper sheet, and a thickness t2 of the Ag—Cu alloy layer is set to be in a range of 1.5 μm or more and 30 μm or less.

According to the insulated circuit board according to the aspect 10 of the present invention, Ag of the bonding material is sufficiently reacted with the copper sheet to bond the ceramic substrate and the copper sheet reliably and firmly, and concurrently, the hardening of the bonded interface is further suppressed.

Advantageous Effects of Invention

According to the aspects of the present invention, it is possible to provide a copper/ceramic bonded body having an excellent thermal cycle reliability, which can suppress the occurrence of breaking in a ceramic member even in a case where a severe thermal cycle is loaded, and an insulated circuit board consisting of the copper/ceramic bonded body.

DESCRIPTION OF EMBODIMENTS

Hereinafter, embodiments of the present invention will be described with reference to the accompanying drawings.

Figure 1:
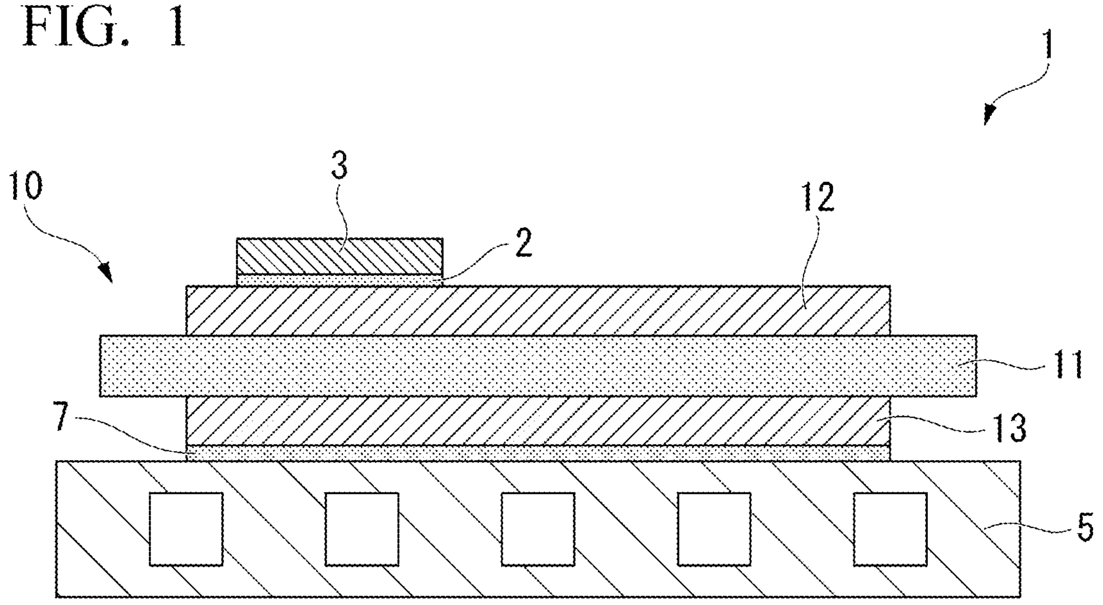
FIG. 1 is a schematic explanatory view of a power module using an insulated circuit board according to the embodiment of the present invention.

A copper/ceramic bonded body according to the present embodiment is an insulated circuit board 10 that includes a ceramic substrate 11 as a ceramic member consisting of ceramics, and a copper sheet 42 (a circuit layer 12) and a copper sheet 43 (a metal layer 13) as copper members consisting of copper or a copper alloy, and the copper sheet 42 (the circuit layer 12) and the copper sheet 43 (the metal layer 13) are bonded to the ceramic substrate 11. FIG. 1 shows a power module 1 including an insulated circuit board 10 according to the present embodiment.

The power module 1 includes the insulated circuit board 10 on which the circuit layer 12 and the metal layer 13 are arranged; a semiconductor element 3 bonded to one surface (the upper surface in FIG. 1) of the circuit layer 12 by interposing a bonding layer 2; and a heat sink 5 disposed on the other side (the lower side in FIG. 1) of the metal layer 13.

The semiconductor element 3 is composed of a semiconductor material such as Si. The semiconductor element 3 and the circuit layer 12 are bonded with the bonding layer 2 being interposed therebetween.

The bonding layer 2 is composed of, for example, an Sn—Ag-based solder material, an Sn—In-based solder material, or an Sn—Ag—Cu-based solder material.

The heat sink 5 is a heat sink for dissipating heat from the insulated circuit board 10 described above. The heat sink 5 is composed of copper or a copper alloy, and in the present embodiment, it is composed of phosphorus deoxidized copper. The heat sink 5 includes a passage for allowing a cooling fluid to flow.

It is noted that in the present embodiment, the heat sink 5 is bonded to the metal layer 13 by a solder layer 7 which consists of a solder material. The solder layer 7 is composed of, for example, an Sn—Ag-based solder material, an Sn—In-based solder material, or an Sn—Ag—Cu-based solder material.

In addition, the insulated circuit board 10 which is the present embodiment includes, as shown in FIG. 1, the ceramic substrate 11, the circuit layer 12 arranged on one surface of the ceramic substrate 11 (the upper surface in FIG. 1), and the metal layer 13 arranged on the other surface of the ceramic substrate 11 (the lower surface in FIG. 1).

The ceramic substrate 11 is composed of ceramics such as silicon nitride ($Si_3N_4$, aluminum nitride (AlN), and alumina ($Al_2O_3$), which are excellent in terms of insulating properties and heat radiation. In the present embodiment, the ceramic substrate 11 is composed of silicon nitride ($Si_3N_4$), which is excellent, particularly in terms of heat radiation. In addition, the thickness of the ceramic substrate 11 is set to be, for example, in a range of 0.2 mm or more and 1.5 mm or less, and the thickness thereof is set to 0.32 mm in the present embodiment.

Figure 4:
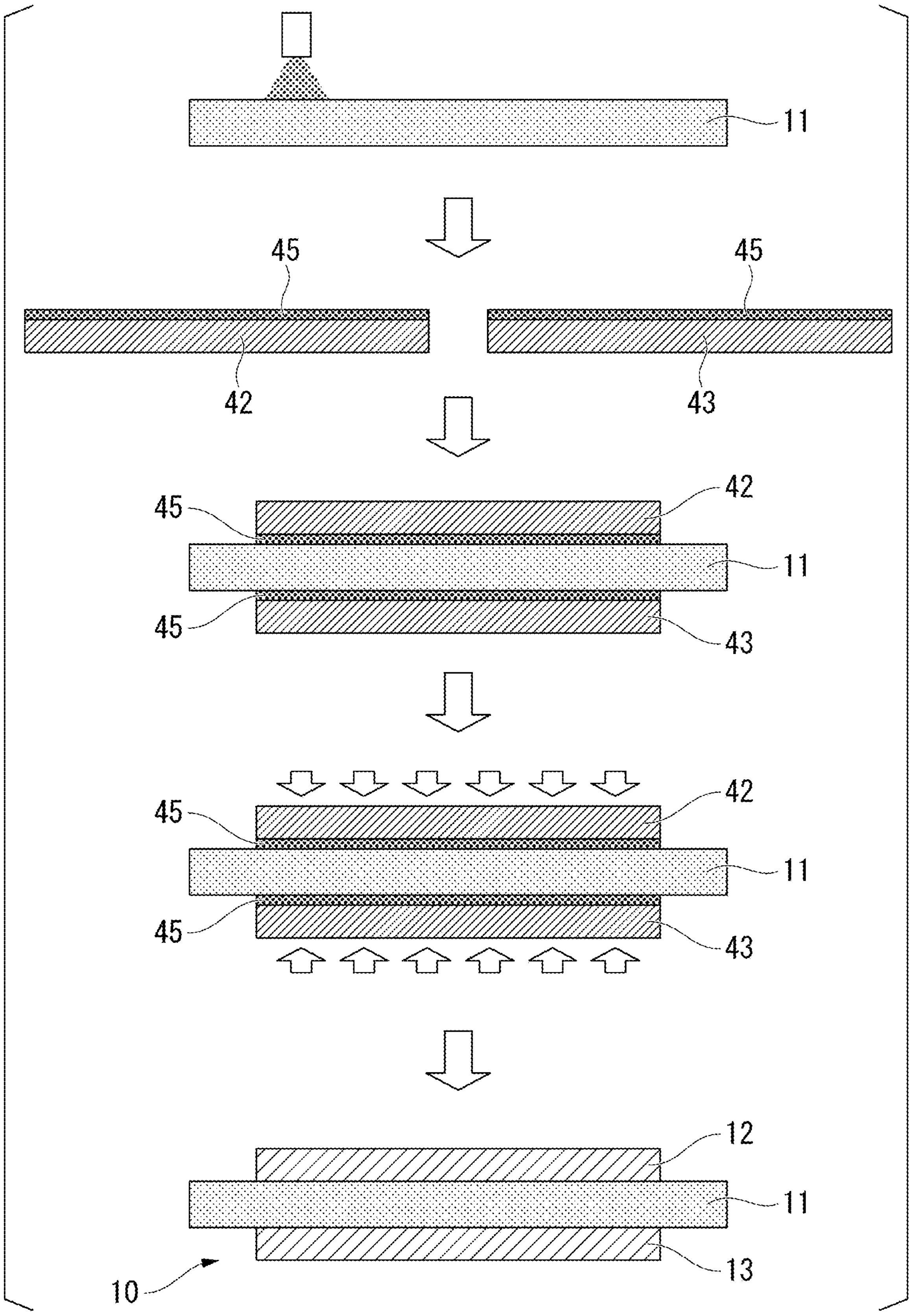
FIG. 4 is a schematic explanatory view of the method for manufacturing the insulated circuit board according to the embodiment of the present invention.

As shown in FIG. 4, the circuit layer 12 is formed by bonding the copper sheet 42 consisting of copper or a copper alloy to one surface (the upper surface in FIG. 4) of the ceramic substrate 11.

In the present embodiment, the circuit layer 12 is formed by bonding a rolled plate of oxygen-free copper to the ceramic substrate 11.

It is noted that the thickness of the copper sheet 42 which is to be the circuit layer 12 is set to be in a range of 0.1 mm or more and 2.0 mm or less, and in the present embodiment, the thickness is set to 0.8 mm.

As shown in FIG. 4, the metal layer 13 is formed by bonding the copper sheet 43 consisting of copper or a copper alloy to the other surface (the lower surface in FIG. 4) of the ceramic substrate 11.

In the present embodiment, the metal layer 13 is formed by bonding a rolled plate of oxygen-free copper to the ceramic substrate 11.

It is noted that the thickness of the copper sheet 43 which is to be the metal layer 13 is set to be in a range of 0.1 mm or more and 2.0 mm or less, and in the present embodiment, the thickness is set to 0.8 mm.

Figure 2A:
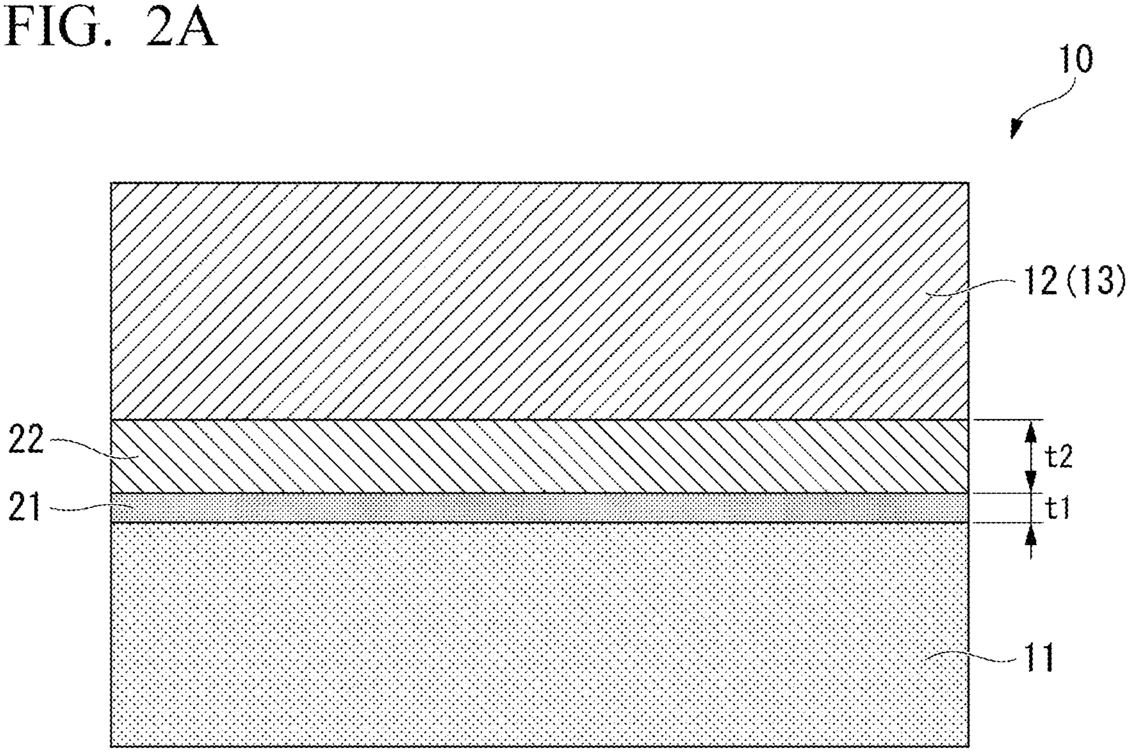
FIG. 2A is an enlarged explanatory view of a bonded interface between each of a circuit layer and a metal layer and a ceramic substrate in the insulated circuit board according to the embodiment of the present invention.

At the bonded interface between the ceramic substrate 11 and the circuit layer 12 and the bonded interface between the ceramic substrate 11 and the metal layer 13, an active metal compound layer 21 and an Ag—Cu alloy layer 22 are formed in this order from the ceramic substrate 11 side, as shown in FIG. 2A.

The active metal compound layer 21 is a layer consisting of a compound of an active metal (Ti, Zr, Nb, or Hf), which is used in a bonding material 45. More specifically, in a case where the ceramic substrate consists of silicon nitride ($Si_3N_4$) or aluminum nitride (AlN), the active metal compound layer 21 is a layer consisting of a nitride of this active metal, and in a case where the ceramic substrate consists of alumina ($Al_2O_3$), the active metal compound layer 21 is a layer consisting of an oxide of this active metal.

It is noted that in the present embodiment, since the bonding material 45 contains Ti as an active metal and the ceramic substrate 11 is composed of silicon nitride ($Si_3N_4$), the active metal compound layer 21 is composed of titanium nitride (TiN).

Figure 2B:
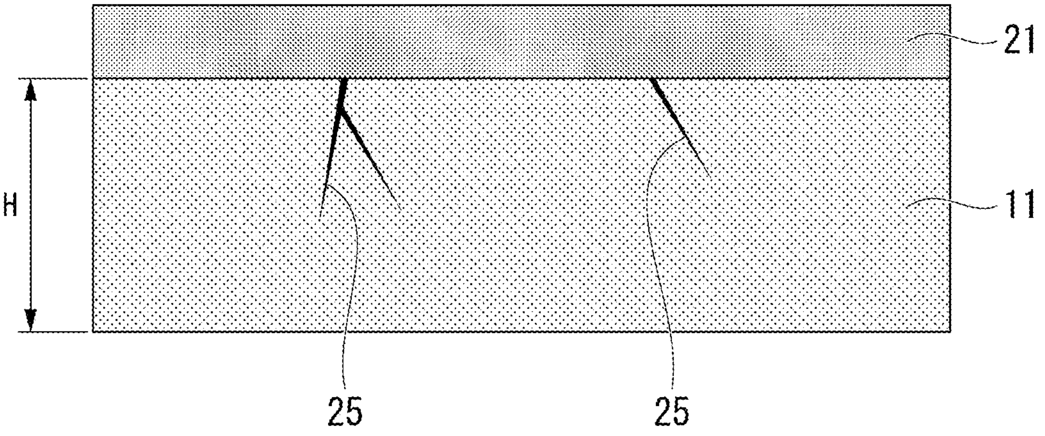
FIG. 2B is an enlarged explanatory view of a portion on a ceramic substrate side, in the bonded interface between each of the circuit layer and the metal layer and the ceramic substrate in the insulated circuit board according to the embodiment of the present invention.

In addition, in the insulated circuit board 10 which is the present embodiment, microcracks 25, which extend from the bonded interface of the ceramic substrate 11 (the surface on the active metal compound layer 21 side, and the interface between ceramic substrate 11 and active metal compound layer 21) toward the inner side of the ceramic substrate 11 (the lower side in FIG. 2B), are present as shown in FIG. 2B, and at least a part of the microcracks 25 are filled with an active metal compound (TiN in the present embodiment) that constitutes the active metal compound layer 21.

In the present embodiment, it is preferable that in the microcrack 25 filled with the active metal compound, the maximum depth H from the bonded interface is set to be in a range of 0.3 μm or more and 3.0 μm or less.

In addition, in the present embodiment, it is preferable that the width W of the microcrack 25 filled with the active metal compound is set to 0.3 μm or less.

In the microcrack 25 filled with the active metal compound, the maximum depth H from the bonded interface can be referred to as a maximum depth H of the active metal compound filled into the microcracks 25 from the bonded interface.

The width W of the microcrack 25 filled with the active metal compound can also be referred to as the width W of the active metal compound filled into the microcrack 25.

In addition, with regard to the maximum depth H from the bonded interface, the bonded interface is an interface between the ceramic substrate 11 and the active metal compound layer 21.

Further, in the present embodiment, it is preferable that the thickness t1 of the active metal compound layer 21 formed at the bonded interface between the ceramic substrate 11 and the circuit layer 12 and at the bonded interface between the ceramic substrate 11 and the metal layer 13 is set to be in a range of 40 nm or more and 600 nm or less.

In addition, in the present embodiment, it is preferable that the thickness t2 of the Ag—Cu alloy layer 22 formed at the bonded interface between the ceramic substrate 11 and the circuit layer 12 and at the bonded interface between the ceramic substrate 11 and the metal layer 13 is set to be in a range of 1.5 μm or more and 30 μm or less.

Figure 3:
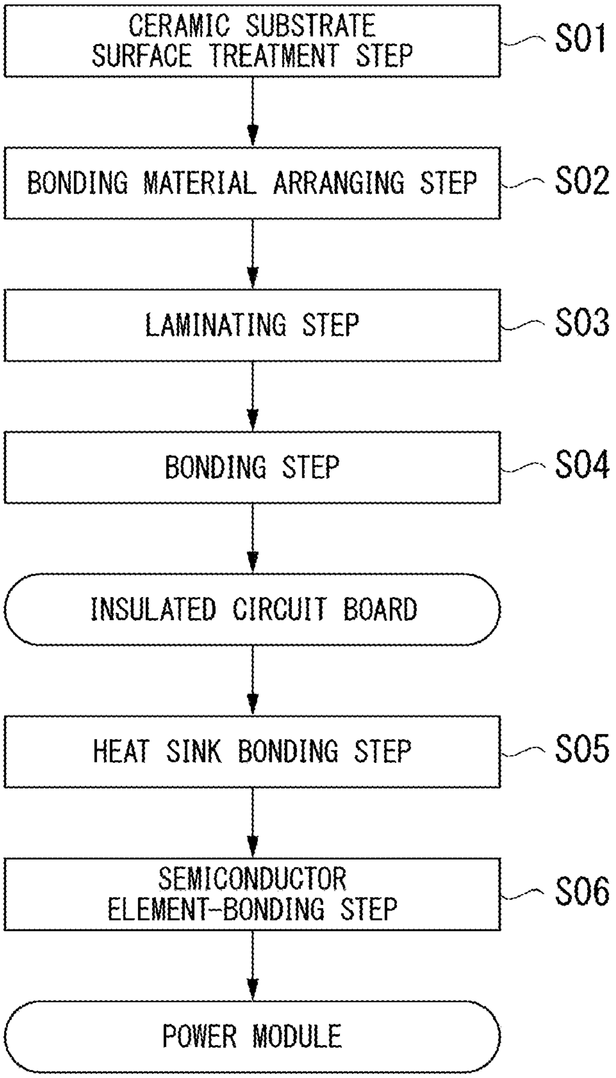
FIG. 3 is a flow chart of a method for manufacturing the insulated circuit board according to the embodiment of the present invention.

Hereinafter, a method for manufacturing the insulated circuit board 10 according to the present embodiment will be described with reference to FIG. 3 and FIG. 4.

(Ceramic substrate surface treatment step S01)

First, the surface, which is to be the bonding surface of the ceramic substrate 11, is subjected to honing processing to form microcracks that extend from the surface toward the inner side of the ceramic substrate 11.

The conditions for the honing processing in the present embodiment are described below.

Abrasive grain: Alumina ($Al_2O_3$) or silicon carbide (SiC)

Pressure: 0.6 MPa or more and 1.2 MPa or less

Time: 5 seconds or more and 30 seconds or less (Bonding Material Arranging Step S02)

Next, the copper sheet 42 which is to be the circuit layer 12 and the copper sheet 43 which is to be the metal layer 13 are prepared.

Then, the bonding material 45 is applied and dried onto the bonding surface of the copper sheet 42 which is to be the circuit layer 12, and the bonding surface of the copper sheet 43 which is to be the metal layer 13. The coating thickness of the paste-like bonding material 45 is preferably set to be in a range of 10 μm or more and 50 μm or less after drying.

In the present embodiment, the paste-like bonding material 45 is applied by screen printing.

The bonding material 45 is a bonding material containing Ag and an active metal (Ti, Zr, Nb, or Hf). In the present embodiment, an Ag—Ti-based brazing material (an Ag—Cu—Ti-based brazing material) is used as the bonding material 45. As the Ag—Ti-based brazing material (the Ag—Cu—Ti-based brazing material), it is preferable to use, for example, a brazing material including: Cu in an amount of 0% by mass or more and 45% by mass or less; and Ti which is an active metal in an amount of 0.5% by mass or more and 20% by mass or less, with a balance of Ag and inevitable impurities.

The specific surface area of the Ag powder contained in the bonding material 45 is preferably set to 0.15 $m^2/g$ or more, more preferably set to 0.25 $m^2/g$ or more, and still more preferably set to 0.40 $m^2/g$ or more. On the other hand, the specific surface area of the Ag powder contained in the bonding material 45 is preferably set to 1.40 $m^2/g$ or less, more preferably set to 1.00 $m^2/g$ or less, and still more preferably set to 0.75 $m^2/g$ or less.

(Laminating Step S03)

Next, the copper sheet 42 which is to be the circuit layer 12 is laminated on one surface (the upper surface in FIG. 4) of the ceramic substrate 11 by interposing the bonding material 45 therebetween, and concurrently, the copper sheet 43 which is to be the metal layer 13 is laminated on the other surface (the lower surface in FIG. 4) of the ceramic substrate 11 by interposing the bonding material 45 therebetween.

(Bonding Step S04)

Next, the copper sheet 42, the ceramic substrate 11, and the copper sheet 43 are heated in a pressurized state in a heating furnace in a vacuum atmosphere, and the bonding material 45 is melted. Thereafter, cooling is carried out to solidify the molten bonding material 45; and thereby, the copper sheet 42 which is to be the circuit layer 12 is bonded to the ceramic substrate 11, and the copper sheet 43 which is to be the metal layer 13 is bonded to the ceramic substrate 11.

The heating temperature (holding temperature) in the bonding step S04 is preferably set to be in a range of 800° C. or higher and 850° C. or lower. It is preferable that the total of the temperature integral values in the temperature raising step from 780° C. to the holding temperature and the holding step at the holding temperature is set to be in a range of 7° C.·h or more and 3500° C.·h or less.

In addition, the pressurization load in the bonding step S04 is preferably set to be in a range of 0.029 MPa or more and 2.94 MPa or less.

Further, the degree of vacuum in the bonding step S04 is preferably set to be in a range of $1\times10^{-6}$ Pa or more and $5\times10^{-2}$ Pa or less.

In addition, the cooling rate during cooling is preferably set to be in a range of 2° C./min or more and 20° C./min or less. It is noted that this cooling rate is a cooling rate from the holding temperature to 780° C., which is an Ag—Cu eutectic temperature.

As described above, the insulated circuit board 10 which is the present embodiment is manufactured by the ceramic substrate surface treatment step S01, the bonding material arranging step S02, the laminating step S03, and the bonding step S04.

(Heat Sink Bonding Step S05)

Next, the heat sink 5 is bonded to the other surface side of the metal layer 13 of the insulated circuit board 10.

The insulated circuit board 10 and the heat sink 5 are laminated with a solder material being interposed therebetween and charged into a heating furnace, and the insulated circuit board 10 and the heat sink 5 are subjected to solder bonding with the solder layer 7 being interposed therebetween.

(Semiconductor Element-Bonding Step S06)

Next, the semiconductor element 3 is bonded by soldering to one surface of the circuit layer 12 of the insulated circuit board 10.

The power module 1 shown in FIG. 1 is produced by the above-described steps.

According to the insulated circuit board 10 (copper/ceramic bonded body) according to the present embodiment which is configured as described above, since the microcracks 25 that extend from the bonded interface toward an inner side of the ceramic substrate 11 are present in the ceramic substrate 11, and at least a part of the microcracks 25 are filled with the active metal compound, it is possible to suppress the occurrence of ceramic breaking starting from the microcracks 25, and it is possible to suppress the occurrence of breaking of the ceramic substrate 11 during loading of a thermal cycle. In addition, due to the anchor effect of the active metal compound filled into the microcracks 25, it is possible to improve the bonding strength between the ceramic substrate 11 and each of the circuit layer 12 and the metal layer 13, Therefore, even in a case where a severe thermal cycle is loaded, it is possible to suppress the breaking in the ceramic substrate 11, or the decreases in the bonding rate between the circuit layer 12 and the ceramic substrate 11 and the bonding rate between the metal layer 13 and the ceramic substrate 11, and it is possible to improve the thermal cycle reliability.

In the insulated circuit board 10 according to the present embodiment, in a case where in the microcrack 25 filled with the active metal compound, the maximum depth H from the bonded interface is set to be in a range of 0.3 μm or more and 3.0 μm or less, the anchor effect of the active metal compound filled into the microcracks 25 makes it possible to reliably improve the bonding strength between the ceramic substrate 11 and the circuit layer 12 and the bonding strength between the ceramic substrate 11 and the metal layer 13, and concurrently, it is possible to reliably suppress the occurrence of breaking in the ceramic substrate 11, where the breaking starts from the microcracks 25.

It is noted that the lower limit of the maximum depth H of the microcrack 25 filled with the active metal compound, where the maximum depth H is a depth from the bonded interface, is more preferably 0.35 μm or more, and still more preferably 0.4 μm or more. On the other hand, the upper limit of the maximum depth H of the microcrack 25 filled with the active metal compound, where the maximum depth H is a depth from the bonded interface, is more preferably 2.3 μm or less, and still more preferably 1.8 μm or less.

In addition, in the insulated circuit board 10 according to the present embodiment, in a case where the width W of the microcrack 25 filled with the active metal compound is 0.3 μm or less, it is possible to reliably suppress the occurrence of breaking in the ceramic substrate 11, where the breaking starts from the microcracks 25.

It is noted that the upper limit of the width W of the microcrack 25 filled with the active metal compound is more preferably 0.27 μm or less, and still more preferably 0.25 μm or less. On the other hand, the lower limit of the width W of the microcrack 25 filled with the active metal compound is not particularly limited; however, it is preferably 0.02 μm or more, and more preferably 0.1 μm or more.

In addition, in the insulated circuit board 10 according to the present embodiment, in a case where the thickness t1 of the active metal compound layer 21 is set to be in a range of 40 nm or more and 600 nm or less, the active metal reliably and firmly bonds the ceramic substrate 11 and each of the circuit layer 12 and the metal layer 13, and concurrently, the hardening of the bonded interface is further suppressed.

It is noted that the lower limit of the thickness t1 of the active metal compound layer 21 is more preferably 70 nm or more, and still more preferably 100 nm or more. On the other hand, the upper limit of the thickness t1 of the active metal compound layer 21 is more preferably 500 nm or less, and still more preferably 300 nm or less.

Further, in the insulated circuit board 10 according to the present embodiment, in a case where the Ag—Cu alloy layer 22 is formed at the bonded interface between the ceramic substrate 11 and the circuit layer 12 and the bonded interface between the ceramic substrate 11 and the metal layer 13, and the thickness t2 of the Ag—Cu alloy layer 22 is set to be in a range of 1.5 μm or more and 30 μm or less, Ag contained in the bonding material 45 is sufficiently reacted with the copper sheet 42 which is to be the circuit layer 12 and the copper sheet 43 which is to be the metal layer 13; and thereby, each of the circuit layer 12 and the metal layer 13 is reliably and firmly bonded to the ceramic substrate 11, and concurrently, the hardening of the bonded interface is further suppressed.

It is noted that the lower limit of the thickness t2 of the Ag—Cu alloy layer 22 is more preferably 3 μm or more, and still more preferably 5 μm or more. On the other hand, the upper limit of the thickness t2 of the Ag—Cu alloy layer 22 is more preferably 25 μm or less, and still more preferably 20 μm or less.

Although the embodiments of the present invention were described above, the present invention is not limited thereto, and appropriate modification is possible in a range not departing from the technical features of the invention.

For example, the present embodiment has been described such that a semiconductor element is mounted on an insulated circuit board to constitute a power module; however, the present invention is not limited thereto. For example, an LED element may be mounted on a circuit layer of an insulated circuit board to constitute an LED module, or a thermoelectric element may be mounted on a circuit layer of an insulated circuit board to constitute a thermoelectric module.

In addition, in the insulated circuit board according to the present embodiment, the description has been made using, as an example, a ceramic substrate composed of silicon nitride ($Si_3N_4$). However, the present invention is not limited thereto, and the insulated circuit board may be an insulated circuit board that uses another ceramic substrate such as alumina ($Al_2O_3$) or aluminum nitride (AlN).

Further, in the present embodiment, the description has been made using Ti as an example of the active metal contained in the bonding material. However, the present invention is not limited thereto, and any one or more active metals selected from Ti, Zr, Hf, and Nb may be contained. It is noted that these active metals may be contained as hydrides.

In addition, in the present embodiment, the description has been made such that the bonding material is arranged on the bonding surface of the copper sheet. However, the present invention is not limited thereto, and thus, it suffices that the bonding material is arranged between the ceramic substrate and the copper sheet, and the bonding material may be arranged on the bonding surface of the ceramic substrate.

Further, in the present embodiment, the description has been made such that the circuit layer is formed by bonding a rolled plate of oxygen-free copper to the ceramic substrate. However, the present invention is not limited thereto, and the circuit layer may be formed by being bonded to the ceramic substrate in a state where copper pieces obtained by punching a copper sheet are disposed in a circuit pattern. In this case, it suffices that each of the copper pieces has such an interface structure as described above between the copper piece and the ceramic substrate.

EXAMPLES

Hereinafter, a description will be given for the results of confirmatory experiments carried out to confirm the effectiveness of the present invention.

First, ceramic substrates (40 mm×40 mm) shown in Table 1 were prepared. It is noted that the thicknesses of the AlN plate and the $Al_2O_3$ plate were set to 0.635 mm, and the thickness of the $Si_3N_4$ plate was set to 0.32 mm.

Then, the bonding surface of the ceramic substrate was subjected to a honing treatment under the conditions shown in Table 2 to form microcracks.

In addition, as the copper sheet which was to be each of the circuit layer and the metal layer, a copper sheet consisting of oxygen-free copper and having a thickness of 37 mm×37 mm shown in Table 1 was prepared.

A bonding material containing an Ag powder and an active metal powder shown in Table 1 was applied onto the copper sheet which was to be each of the circuit layer and the metal layer so that the targeted thickness after drying was the value shown in Table 1.

It is noted that a paste material was used as the bonding material, and the amounts of Ag, Cu, and the active metal were as shown in Table 1.

In addition, the BET value (specific surface area) of the Ag powder was measured as follows. Using a specific surface area/pore diameter measuring apparatus (AUTOSORB-1 manufactured by Quantachrome Instruments), vacuum degassing was carried out as a pretreatment while carrying out heating at 150° C. for 30 minutes, subsequently, the amount of adsorbed $N_2$ was measured at a liquid nitrogen temperature of 77 K, and the BET value was measured by the BET multipoint method.

Next, a copper sheet which is to be a circuit layer was laminated on one surface of the ceramic substrate. In addition, a copper sheet which is to be a metal layer was laminated on the other surface of the ceramic substrate.

This laminate was heated in a state of being pressurized in the lamination direction to generate an Ag—Cu liquid phase. At this time, the pressurization load was set to 0.294 MPa, and the temperature integral value within a temperature range of 780° C. or higher and 850° C. or lower was set as shown in Table 2.

Then, the heated laminate was cooled to bond the copper sheet which was to be the circuit layer and the ceramic substrate to each other and to bond the metal plate which was to be the metal layer and the ceramic substrate to each other; and thereby, an insulated circuit board (copper/ceramic bonded body) was obtained.

Regarding the obtained insulated circuit board (copper/ceramic bonded body), the presence or absence of the microcracks filled with the active metal compound, the maximum depth H of the microcrack filled with the active metal compound, where the maximum depth H was a depth from the bonded interface, the width W of the microcrack filled with the active metal compound, the area rate of the active metal compound, the thickness t1 of the active metal compound layer, the thickness t2 of the Ag—Cu alloy layer, and the thermal cycle reliability were evaluated as follows.

(Active Metal Compound Layer)

Cross sections of the bonded interface between the circuit layer and the ceramic substrate and the bonded interface between the ceramic substrate and the metal layer were observed at a magnification of 30000 times and an acceleration voltage of 1.8 kV by using an electron scanning microscope (SEM) (ULTRA55 manufactured by Carl Zeiss NTS, LLC), and element maps of N, O, and the active metal element were acquired in both the five visual fields according to the energy dispersive X-ray analysis method. It was determined that the active metal compound layer was present in a case where the active metal element and N or O were present in the same region.

The observation was carried out in both the five visual fields, a total of ten visual fields, and an area of a region in which the active metal element and N or O were present in the same region was divided by the measured width of the region, and the average value of the measured numerical values was described as "Thickness t1 of active metal compound layer" in Table 2.

(Evaluation of Microcrack Filled with Active Metal Compound)

A cross section of the bonded interface between the circuit layer and the ceramic substrate was observed using an electron scanning microscope (SEM) (ULTRA55 manufactured by Carl Zeiss NTS, LLC) at a magnification of 10000 times, and images in ten visual fields were captured. In addition, in the captured ten visual fields, element maps of N, O, and the active metal element were acquired according to the energy dispersive X-ray analysis method, and a portion where the active metal element and N or O were present together was specified as the active metal compound. A microcrack which was not filled with an active metal compound could be confirmed in an SEM photographic image. However, it was difficult to specify the microcrack itself in element maps as long as the microcrack was not filled with the active metal compound. For this reason, a portion where the active metal compound has entered the inner side of the ceramic substrate by a length of 0.3×t1 or more regarding the "thickness t1 of the active metal compound layer" calculated as described above was defined as "the microcrack filled with the active metal compound". A case where "the microcrack filled with the active metal compound" was observed in eight or more visual fields among the ten visual fields observed was evaluated as "○" (the microcrack filled with the active metal compound was present). The other cases were evaluated as "x" (the microcrack filled with the active metal compound was absent).

In addition, Table 2 shows the maximum depth H of the microcrack filled with the active metal compound, where the maximum depth H was a depth from the bonded interface, and the width W of the microcrack filled with the active metal compound.

Figure 5:
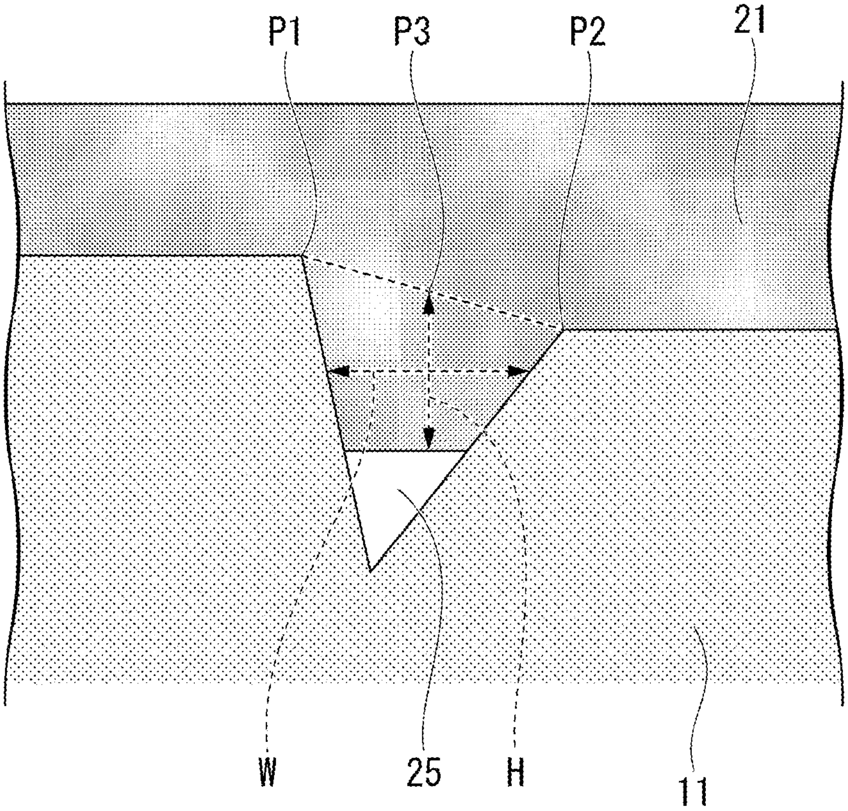
FIG. 5 is a schematic explanatory view of a maximum depth H and a width W of a microcrack filled with an active metal compound in Examples.

The maximum depth H was measured as follows. Regarding the "the microcrack filled with the active metal compound" which had been observed in each visual field, the longest distance in the lamination direction from a midpoint (P3) of a straight line connecting two points (P1 and P2) on an end of a crack on the active metal compound layer side toward the ceramic substrate side of the active metal compound which was filled into the crack was defined as the maximum depth H. Table 2 shows the average value of the maximum depths H of "the microcracks filled with the active metal compounds", where each microcrack has been observed (see FIG. 5).

The width W was measured as follows. Regarding the "the microcrack filled with the active metal compound" which had been observed in each visual field, an imaginary line in a direction perpendicular to the lamination direction of the active metal compound layer and the ceramic substrate was drawn at an intermediate point of a line segment indicating the maximum depth H among line segments drawn from the midpoint (P3) toward the ceramic substrate side in the lamination direction, and a distance between both ends of the crack (between two points where the imaginary line and the crack intersected) was defined as the width W. Table 2 shows the average value of the widths W of "the microcracks filled with the active metal compounds", where each microcrack has been observed (see FIG. 5).

(Ag—Cu Alloy Layer)

Regarding a cross section of a bonded interface between the circuit layer and the ceramic substrate and a cross section of a bonded interface between the ceramic substrate and the metal layer, an element map of each of Ag, Cu, and the active metal was acquired by using an EPMA apparatus (JXA-8230 manufactured by JEOL Ltd.) at an acceleration voltage of 15.0 kV. Each element map was acquired in both the five visual fields.

The observation was carried out in both the five visual fields, a total of ten visual fields, and a region in which the Ag concentration was 15% by mass or more was defined as the Ag—Cu alloy layer in a case where Ag+Cu+active metal was set to 100% by mass, and an area thereof was measured and a value was obtained by dividing the area by a width of the measurement region (area/width of measurement region). The average value of the values is described as the thickness t2 of the Ag—Cu alloy layer in Table 2.

(Thermal Cycle Reliability)

The above-described insulated circuit board was subjected to the loading of the following thermal cycle according to the material of the ceramic substrate, and then the presence or absence of ceramic breaking was determined according to an SAT examination. The evaluation results are shown in Table 2.

Case of AlN or $Al_2O_3$: The thermal cycle was carried out up to 500 cycles under the condition of −40° C.×10 min←→150° C.×10 min. An SAT examination was carried out every 50th cycle.

Case of $Si_3N_4$: The thermal cycle was carried out up to 2000 cycles under the condition of −40° C.×5 min←→150° C.×5 min. An SAT examination was carried out every 200th cycle.

TABLE 1

| | | Ceramic substrate | Circuit layer Thickness | Metal layer Thickness | Bonding material | | | | BET value of Ag powder | Coating thickness |
|---|---|---|---|---|---|---|---|---|---|---|
| | | | | | | Cu | Active element | | | |
| | | Material | (mm) | (mm) | Ag | (mass %) | Element | (mass %) | ($m^2/g$) | (μm) |
| Invention | 1 | AlN | 0.8 | 0.8 | Balance | 0.0 | Ti | 6.0 | 0.15 | 20 |
| Example | 2 | AlN | 0.8 | 0.8 | Balance | 10.0 | Ti | 6.0 | 0.25 | 15 |
| | 3 | AlN | 0.8 | 0.8 | Balance | 20.0 | Ti | 6.0 | 0.40 | 13 |
| | 4 | $Si_3N_4$ | 0.8 | 0.8 | Balance | 0.0 | Ti | 6.0 | 1.40 | 13 |
| | 5 | $Si_3N_4$ | 0.8 | 0.8 | Balance | 10.0 | Ti | 6.0 | 1.00 | 10 |
| | 6 | $Si_3N_4$ | 0.8 | 0.8 | Balance | 20.0 | Ti | 6.0 | 0.75 | 10 |
| | 7 | $Al_2O_3$ | 0.8 | 0.8 | Balance | 0.0 | Ti | 6.0 | 0.56 | 13 |
| | 8 | $Al_2O_3$ | 0.8 | 0.8 | Balance | 10.0 | Ti | 6.0 | 0.32 | 13 |
| Example | 1 | AlN | 0.8 | 0.8 | Balance | 10.0 | Ti | 6.0 | 0.40 | 13 |
| Comparative | 2 | AlN | 0.8 | 0.8 | Balance | 20.0 | Ti | 6.0 | 0.40 | 13 |
| | 3 | $Si_3N_4$ | 0.8 | 0.8 | Balance | 0.0 | Ti | 6.0 | 0.40 | 13 |
| | 4 | $Si_3N_4$ | 0.8 | 0.8 | Balance | 10.0 | Ti | 6.0 | 0.50 | 13 |
| | 5 | $Al_2O_3$ | 0.8 | 0.8 | Balance | 0.0 | Ti | 6.0 | 1.50 | 13 |
| | 6 | $Al_2O_3$ | 0.8 | 0.8 | Balance | 10.0 | Ti | 6.0 | 0.14 | 13 |

TABLE 2

| | | Honing treatment: Abrasive grains: Material | Honing treatment: Average grain diameter (μm) | Honing treatment: Pressure (MPa) | Honing treatment: Time (second) | Bonding step: Temperature integral value (° C · h) | Microcrack filled with active metal compound: Evaluation | Microcrack filled with active metal compound: Maximum depth H (μm) | Microcrack filled with active metal compound: Width W (μm) | Thickness t1 of active metal compound layer (nm) | Thickness t2 of Ag—Cu alloy layer (μm) | Thermal cycle reliability: Presence or absence of breaking occurrence |
|---|---|---|---|---|---|---|---|---|---|---|---|---|
| Invention Example | 1 | $Al_2O_3$ | 37 | 0.6 | 30 | 2500 | ○ | 2.30 | 0.30 | 500 | 30 | Absent |
| | 2 | $Al_2O_3$ | 37 | 1.2 | 5 | 2500 | ○ | 0.40 | 0.27 | 400 | 22 | Absent |
| | 3 | SiC | 37 | 0.7 | 10 | 2500 | ○ | 3.00 | 0.26 | 600 | 25 | Absent |
| | 4 | $Al_2O_3$ | 37 | 0.7 | 10 | 2500 | ○ | 0.30 | 0.02 | 40 | 10 | Absent |
| | 5 | $Al_2O_3$ | 37 | 0.8 | 10 | 2500 | ○ | 1.20 | 0.17 | 70 | 2 | Absent |
| | 6 | SiC | 37 | 0.7 | 20 | 2500 | ○ | 1.80 | 0.25 | 180 | 5 | Absent |
| | 7 | $Al_2O_3$ | 37 | 0.7 | 10 | 2500 | ○ | 0.35 | 0.20 | 100 | 13 | Absent |
| | 8 | SiC | 37 | 1.0 | 5 | 2500 | ○ | 1.60 | 0.10 | 300 | 17 | Absent |
| Example Comparative | 1 | — | — | — | — | 2500 | x | — | — | 650 | 17 | Present |
| | 2 | — | — | — | — | 2500 | x | — | — | 300 | 14 | Present |
| | 3 | — | — | — | — | 2500 | x | — | — | 35 | 16 | Present |
| | 4 | — | — | — | — | 2500 | x | — | — | 120 | 12 | Present |
| | 5 | — | — | — | — | 2500 | x | — | — | 200 | 15 | Present |
| | 6 | — | — | — | — | 2500 | x | — | — | 350 | 18 | Present |

In Comparative Examples 1 to 6, "the microcrack filled with the active metal compound" was evaluated as x, and thus breaking occurred during the thermal cycle, and the thermal cycle reliability was inferior.

On the other hand, in Invention Examples 1 to 8, "the microcrack filled with the active metal compound" was evaluated as ○, and thus breaking did not occur during the thermal cycle, and the thermal cycle reliability was excellent.

From the results of the above-described confirmatory experiments, according to Invention Examples, it has been confirmed that it is possible to provide an insulated circuit board (a copper/ceramic bonded body) having an excellent thermal cycle reliability, which can suppress the occurrence of breaking in a ceramic member even in a case where a severe thermal cycle is loaded.

INDUSTRIAL APPLICABILITY

The copper/ceramic bonded body and the insulated circuit board according to the present embodiment are suitably applied to power modules, LED modules, and thermoelectric modules.

REFERENCE SIGNS LIST

10: Insulated circuit board (copper/ceramic bonded body)
11: Ceramic substrate (ceramic member)
12: Circuit layer (copper member)
13: Metal layer (copper member)
21: Active metal compound layer
22: Ag—Cu alloy layer
25 Microcrack

What is claimed is:

1. A copper/ceramic bonded body comprising:

a copper member consisting of copper or a copper alloy; and a ceramic member, wherein the copper member is bonded to the ceramic member, an active metal compound layer consisting of an active metal compound is formed on a side of the ceramic member at a bonded interface between the ceramic member and the copper member, microcracks that extend from the bonded interface toward an inner side of the ceramic member are present in the ceramic member, and at least a part of the microcracks are filled with the active metal compound, and the active metal compound is a compound of one or more active materials selected from Ti, Zr, Nb, and Hf.

2. The copper/ceramic bonded body according to claim 1, wherein in the microcrack filled with the active metal compound, a maximum depth H from the bonded interface is set to be in a range of 0.3 μm or more and 3.0 μm or less.

3. The copper/ceramic bonded body according to claim 2, wherein a width W of the microcrack filled with the active metal compound is 0.3 μm or less.

4. The copper/ceramic bonded body according to claim 2, wherein a thickness t1 of the active metal compound layer is set to be in a range of 40 nm or more and 600 nm or less.

5. The copper/ceramic bonded body according to claim 2, wherein at the bonded interface between the ceramic member and the copper member, an Ag—Cu alloy layer is formed on a side of the copper member, and a thickness t2 of the Ag—Cu alloy layer is set to be in a range of 1.5 μm or more and 30 μm or less.

6. The copper/ceramic bonded body according to claim 1, wherein a width W of the microcrack filled with the active metal compound is 0.3 μm or less.

7. The copper/ceramic bonded body according to claim 1, wherein a thickness t1 of the active metal compound layer is set to be in a range of 40 nm or more and 600 nm or less.

8. The copper/ceramic bonded body according to claim 1, wherein at the bonded interface between the ceramic member and the copper member, an Ag—Cu alloy layer is formed on a side of the copper member, and a thickness t2 of the Ag—Cu alloy layer is set to be in a range of 1.5 μm or more and 30 μm or less.

9. An insulated circuit board comprising:

a copper sheet consisting of copper or a copper alloy; and a ceramic substrate, wherein the copper sheet is bonded to a surface of the ceramic substrate, an active metal compound layer consisting of an active metal compound is formed on a side of the ceramic substrate at a bonded interface between the ceramic substrate and the copper sheet, microcracks that extend from the bonded interface toward an inner side of the ceramic substrate are present in the ceramic substrate, where at least a part of the microcracks are filled with the active metal compound, and the active metal compound is a compound of one or more active materials selected from Ti, Zr, Nb, and Hf.

10. The insulated circuit board according to claim 9, wherein in the microcrack filled with the active metal compound, a maximum depth H from the bonded interface, is set to be in a range of 0.3 μm or more and 3.0 μm or less.

11. The insulated circuit board according to claim 10, wherein a width W of the microcrack filled with the active metal compound is 0.3 μm or less.

12. The insulated circuit board according to claim 10, wherein a thickness t1 of the active metal compound layer is set to be in a range of 40 nm or more and 600 nm or less.

13. The insulated circuit board according to claim 10, wherein at the bonded interface between the ceramic substrate and the copper sheet, an Ag—Cu alloy layer is formed on a side of the copper sheet, and a thickness t2 of the Ag—Cu alloy layer is set to be in a range of 1.5 μm or more and 30 μm or less.

14. The insulated circuit board according to claim 9, wherein a width W of the microcrack filled with the active metal compound is 0.3 μm or less.

15. The insulated circuit board according to claim 9, wherein a thickness t1 of the active metal compound layer is set to be in a range of 40 nm or more and 600 nm or less.

16. The insulated circuit board according to claim 9, wherein at the bonded interface between the ceramic substrate and the copper sheet, an Ag—Cu alloy layer is formed on a side of the copper sheet, and a thickness t2 of the Ag—Cu alloy layer is set to be in a range of 1.5 μm or more and 30 μm or less.

* * * * *